(12) United States Patent
Akutagawa et al.

(10) Patent No.: US 11,090,691 B2
(45) Date of Patent: Aug. 17, 2021

(54) CLEANING METHOD FOR CLEANING FRAME UNIT

(71) Applicant: DISCO CORPORATION, Tokyo (JP)

(72) Inventors: Yukito Akutagawa, Tokyo (JP); Toshio Tsuchiya, Tokyo (JP); Kentaro Shiraga, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 32 days.

(21) Appl. No.: 16/284,575

(22) Filed: Feb. 25, 2019

(65) Prior Publication Data
US 2019/0270123 A1 Sep. 5, 2019

(30) Foreign Application Priority Data
Mar. 2, 2018 (JP) .............................. JP2018-037621

(51) Int. Cl.
*B08B 3/02* (2006.01)
*H01L 21/02* (2006.01)
*H01L 21/683* (2006.01)
*H01L 21/67* (2006.01)

(52) U.S. Cl.
CPC ........ *B08B 3/024* (2013.01); *H01L 21/02076* (2013.01); *H01L 21/6836* (2013.01); *H01L 2221/68327* (2013.01)

(58) Field of Classification Search
CPC ......... H01L 21/67051; H01L 21/02076; H01L 21/2087; B08B 3/024
See application file for complete search history.

(56) References Cited

U.S. PATENT DOCUMENTS

2007/0054498 A1* 3/2007 Iizuka ................. H01L 21/6715
438/758

FOREIGN PATENT DOCUMENTS

| JP | 09007977 A | | 1/1997 |
| JP | 2000033346 A | | 2/2000 |
| JP | 2008016673 A | * | 1/2008 |

OTHER PUBLICATIONS

Machine translation: JP2008016673A; Matsuyama, T. (Year: 2008).*

* cited by examiner

*Primary Examiner* — Natasha N Campbell
(74) *Attorney, Agent, or Firm* — Greer Burns & Crain, Ltd.

(57) ABSTRACT

A cleaning method for cleaning a frame unit including an affixed object, a tape affixed to an undersurface of the affixed object, and an annular frame to which an outer peripheral portion of the tape is affixed, the cleaning method including: an affixed object cleaning step of cleaning the affixed object by jetting a cleaning liquid from a cleaning nozzle while moving the cleaning nozzle in a reciprocating manner along a path extending from above one end of an outer peripheral edge of the affixed object to above another end of the outer peripheral edge of the affixed object; and a frame cleaning step of cleaning the frame by jetting the cleaning liquid from the cleaning nozzle to the frame.

8 Claims, 8 Drawing Sheets

CLEANING METHOD FOR CLEANING FRAME UNIT

BACKGROUND OF THE INVENTION

Field of the Invention

The present invention relates to a cleaning method of cleaning a frame unit including an affixed object, a tape affixed to an undersurface of the affixed object, and an annular frame to which an outer peripheral portion of the tape is affixed.

Description of the Related Art

In a process of manufacturing device chips used in electronic apparatuses such as mobile telephones, computers, or the like, a plurality of intersecting planned processing lines referred to as streets are set on the top surface of a wafer formed of a semiconductor. A device such for example as an integrated circuit (IC), a large scale integration (LSI), or the like is formed in each of regions of the top surface of the wafer, the regions being demarcated by the planned processing lines. Individual device chips can be formed when the wafer is thereafter divided along the planned processing lines.

The division of the wafer is performed by a processing apparatus such as a cutting apparatus that cuts the wafer by a cutting blade in an annular shape, a laser processing apparatus that processes the wafer by irradiating the wafer with a laser beam, or the like. When the wafer is processed by the processing apparatus, processing waste is produced, and the processing waste scatters onto the top surface and periphery of the wafer. The wafer after the processing is therefore cleaned to remove the processing waste. The processing apparatus is provided with a spinner cleaning apparatus, for example. The wafer after the processing is conveyed to the spinner cleaning apparatus, and cleaned by the spinner cleaning apparatus (see Japanese Patent. Laid-Open No. 2000-33346, for example). The spinner cleaning apparatus includes: a spinner table that holds a to-be-cleaned object; a cleaning nozzle that jets a cleaning liquid; and a liquid feeding pipe that supplies the cleaning liquid to the cleaning nozzle. The to-be-cleaned object is cleaned by moving the cleaning nozzle in a reciprocating manner in a region from above one end of the to-be-cleaned object to above another end of the to-be-cleaned object while rotating the spinner table holding the to-be-cleaned object and jetting the cleaning liquid from the cleaning nozzle.

An adhesive tape stuck to an annular frame is affixed in advance to the undersurface of the wafer to be carried into the processing apparatus. Then, the wafer is carried into the processing apparatus and processed by the processing apparatus in a state of a frame unit in which the wafer, the tape, and the frame are integral with each other. An indication of identification information of the wafer or the like may be disposed on the top surface of the annular frame in order to identify and manage the wafer (see Japanese Patent Laid-Open No. Hei 09-7977, for example). For example, the indication is a bar code, and the processing apparatus obtains the identification information of the wafer by reading the bar code. When a processing unit processes the wafer included in the frame unit, processing waste scatters also onto the indication disposed on the top surface of the annular frame. When the processing waste adheres to the indication, the processing apparatus may not be able to read the identification information from the indication. Accordingly, in order to clean also the frame by jetting the cleaning liquid when cleaning the wafer, the spinner cleaning apparatus moves the cleaning nozzle in a reciprocating manner in a region from above one end of the frame to above another end of the frame.

SUMMARY OF THE INVENTION

The liquid feeding pipe of the spinner cleaning apparatus includes a pipe-shaped shaft portion extending on the outside of the spinner table along a direction perpendicular to the upper surface of the spinner table and reaching a position higher than the height of the upper surface of the spinner table. The liquid feeding pipe further includes a pipe-shaped arm portion having a length corresponding to a distance from the shaft portion to the center of the spinner table and extending in a direction perpendicular to the extending direction of the shaft portion. One end of the arm portion is connected to an upper end of the shaft portion. Another end of the arm portion is provided with the cleaning nozzle facing downward. The cleaning liquid is supplied to the cleaning nozzle through the shaft portion and the arm portion, and the cleaning liquid is jetted downward from the cleaning nozzle. During the cleaning of the to-be-cleaned object, the cleaning nozzle is moved in a reciprocating manner by rotating the liquid feeding pipe with the shaft portion as a rotation axis. As compared with a case where only the wafer is cleaned as the to-be-cleaned object, in a case where the whole of the frame unit including the annular frame is cleaned, a traveling distance of the cleaning nozzle per reciprocation is lengthened, and a required time necessary for one reciprocation of the cleaning nozzle is also correspondingly increased. Hence, a time required to clean the frame unit is longer than a time required to clean only the wafer, and productivity is decreased when the frame is cleaned at the same time as the wafer.

It is accordingly an object of the present invention to provide a cleaning method that can clean a frame unit in a relative short required time.

In accordance with an aspect of the present invention, there is provided a cleaning method for cleaning a frame unit including an affixed object, a tape affixed to an undersurface of the affixed object, and an annular frame to which an outer peripheral portion of the tape is affixed, the cleaning method including: a holding step of holding the frame unit on a holding surface of a spinner table; an affixed object cleaning step of cleaning the affixed object by jetting a cleaning liquid from a cleaning nozzle while rotating the spinner table holding the frame unit and moving the cleaning nozzle in a reciprocating manner along a first path passing above a center of the holding surface and extending from above one end of an outer peripheral edge of the affixed object to above another end of the outer peripheral edge of the affixed object; and a frame cleaning step of cleaning the frame by jetting the cleaning liquid from the cleaning nozzle to the frame while rotating the spinner table.

Preferably, in the frame cleaning step, the affixed object is cleaned together with the frame by moving the cleaning nozzle in a reciprocating manner along a second path passing above the center of the holding surface and extending from above one end of an outer peripheral edge of the frame to above another end of the outer peripheral edge of the frame.

In addition, preferably, in the frame cleaning step, the cleaning nozzle is moved in a reciprocating manner along a second path including only a region above the frame.

A cleaning method according to one mode of the present invention is a cleaning method of cleaning, as a to-be-cleaned object, a frame unit including an affixed object such as a wafer or the like, a tape affixed to an undersurface of the affixed object, and an annular frame to which an outer peripheral portion of the tape is affixed. The cleaning method includes: an affixed object cleaning step of moving a cleaning nozzle in a reciprocating manner along a first path extending from above one end of an outer peripheral edge of the affixed object to above another end of the outer peripheral edge of the affixed object; and a frame cleaning step of cleaning the frame by jetting a cleaning liquid to the frame. A cleaning strength necessary for the affixed object such as a wafer or the like on which devices are formed is different from a cleaning strength necessary for the frame on which an indication of identification information is disposed. Here, a cleaning strength is, for example, the strength of a cleaning action which strength is determined by the length of a cleaning time or the like. Because of the different cleaning strengths necessary for the affixed object and the frame, in a case where both of the affixed object and the frame are cleaned simultaneously in one cleaning step, the frame unit is cleaned with the cleaning strength necessary for one of the affixed object and the frame that needs a high cleaning strength. In this case, the other that needs a low cleaning strength is cleaned excessively.

On the other hand, the cleaning method according to the one mode of the present invention can clean the affixed object and the frame with cleaning strengths necessary for the affixed object and the frame, respectively, by performing the cleaning in two divided steps, that is, the affixed object cleaning step and the frame cleaning step. That is, a time of excess cleaning performed for one of the affixed object and the frame that needs a low cleaning strength can be omitted, and therefore a time taken to clean the frame unit can be shortened.

Hence, the present invention provides a cleaning method that can clean a frame unit in a relatively short required time.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
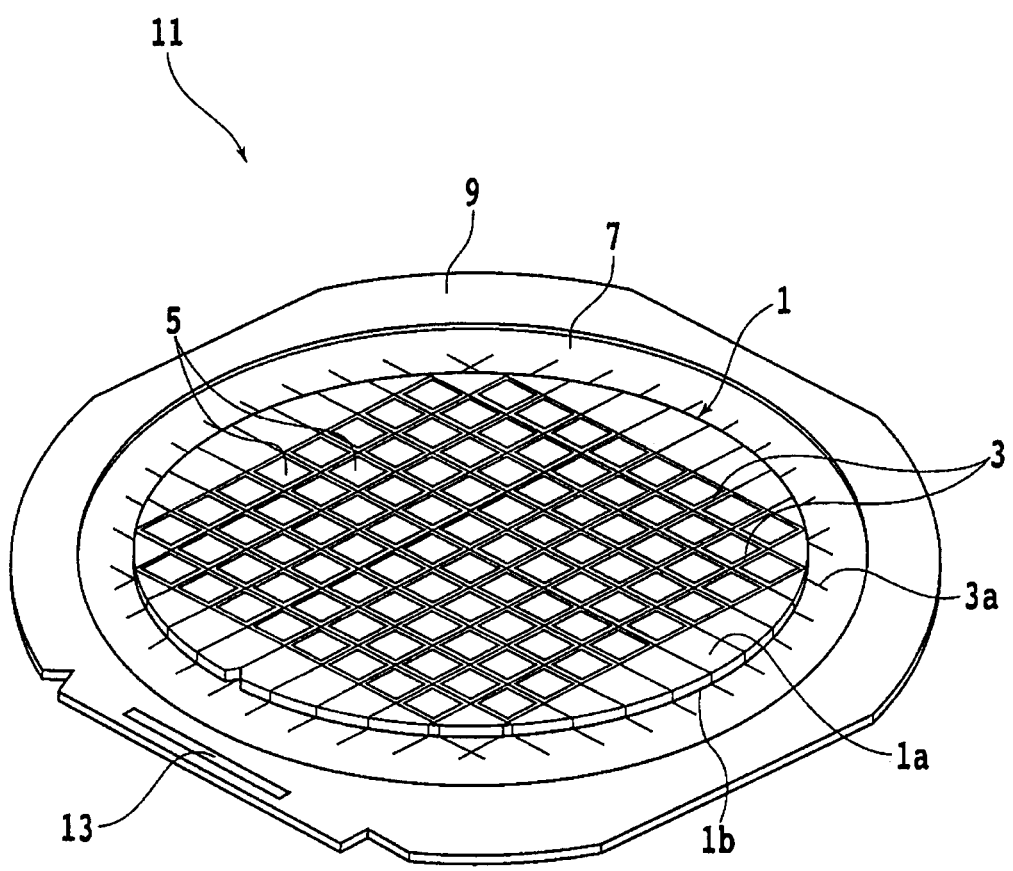
FIG. 1 is a perspective view schematically depicting a frame unit.

An embodiment according to one mode of the present invention will be described with reference to the accompanying drawings. A cleaning method according to the present embodiment cleans a frame unit including an affixed object such as a semiconductor wafer or the like. FIG. 1 is a perspective view schematically depicting a frame unit cleaned by the cleaning method according to the present embodiment. As depicted in FIG. 1, a frame unit 11 includes an affixed object 1, a tape 7 affixed to an undersurface 1b of the affixed object 1, and an annular frame 9 to which the periphery of the tape 7 is affixed. The affixed object 1 is, for example, a disk-shaped wafer formed of a semiconductor material such as silicon or the like or a substrate formed of glass, sapphire, or the like. The material, shape, structure, and the like of the affixed object 1 are not limited. For example, a substrate formed of a material such as a ceramic, a resin, a metal, or the like and a rectangular substrate may be used as the affixed object 1.

A plurality of intersecting planned processing lines (streets) 3 are set on a top surface 1a side of the affixed object 1. Devices 5 such as ICs, LSIs, or the like are formed in regions demarcated by the planned processing lines 3. Individual device chips can be formed when the affixed object 1 is divided along the planned processing lines 3. Before a processing apparatus processes the affixed object 1, the tape 7 affixed to the annular frame 9 is affixed to the undersurface 1b of the affixed object 1, so that the frame unit 11 having the affixed object 1, the annular frame 9, and the tape 7 integral with each other is formed. The affixed object 1 is supported by the frame 9 via the tape 7, and is carried into the processing apparatus and processed by the processing apparatus in a state of the frame unit 11. The upper surface of the frame 9 is provided with, for example, a bar code storing identification information of the affixed object 1 as an indication 13 of the identification information. The processing apparatus obtains the identification information by reading the indication 13 of the identification information when processing the affixed object 1.

The processing apparatus that processes the affixed object 1 is, for example, a cutting apparatus provided with an annular cutting blade, a laser processing apparatus provided with a laser processing unit that applies a laser beam, or the like. The processing apparatus processes the affixed object 1 along the planned processing lines 3, and divides the affixed object 1 along the planned processing lines 3. FIG. 1 depicts the affixed object 1 after being processed by the processing apparatus. As depicted in FIG. 1, processing traces 3a are formed on the affixed object 1 and the tape 7. Then, processing waste produced by the processing scatters and adheres onto the frame unit 11. When the processing waste adheres to the top surface of the affixed object 1, the processing waste remains on the device chips formed by dividing the affixed object 1. In addition, the processing waste adhering onto the affixed object 1 and the tape 7 falls off inside and outside the processing apparatus and becomes a source of contamination. In addition, the processing waste may also adheres to the indication 13 of the identification information, the indication 13 being formed on the upper surface of the frame 9, and render the indication 13 of the identification information unreadable. Accordingly, the processing waste is removed by supplying a cleaning liquid to the upper surface of the frame unit 11.

In addition, for example, in a case where the laser processing apparatus performs laser ablation processing on the affixed object 1 along the planned processing lines 3, the top surface of the affixed object 1 is coated with a water-soluble resin in advance. In this case, the processing waste produced by the processing adheres to the water-soluble resin. The processing waste can therefore be removed from the top surface of the affixed object 1 by removing the water-soluble resin. The water-soluble resin can be removed when the affixed object 1 is cleaned. However, the water-soluble resin also scatters and adheres to the upper surface of the tape 7 and the upper surface of the frame 9 when applied to the top surface of the affixed object 1. Accordingly, not only the affixed object 1 but also the tape 7 and the frame 9 are cleaned in order to reliably remove the water-soluble resin from the frame unit 11.

Figure 2:
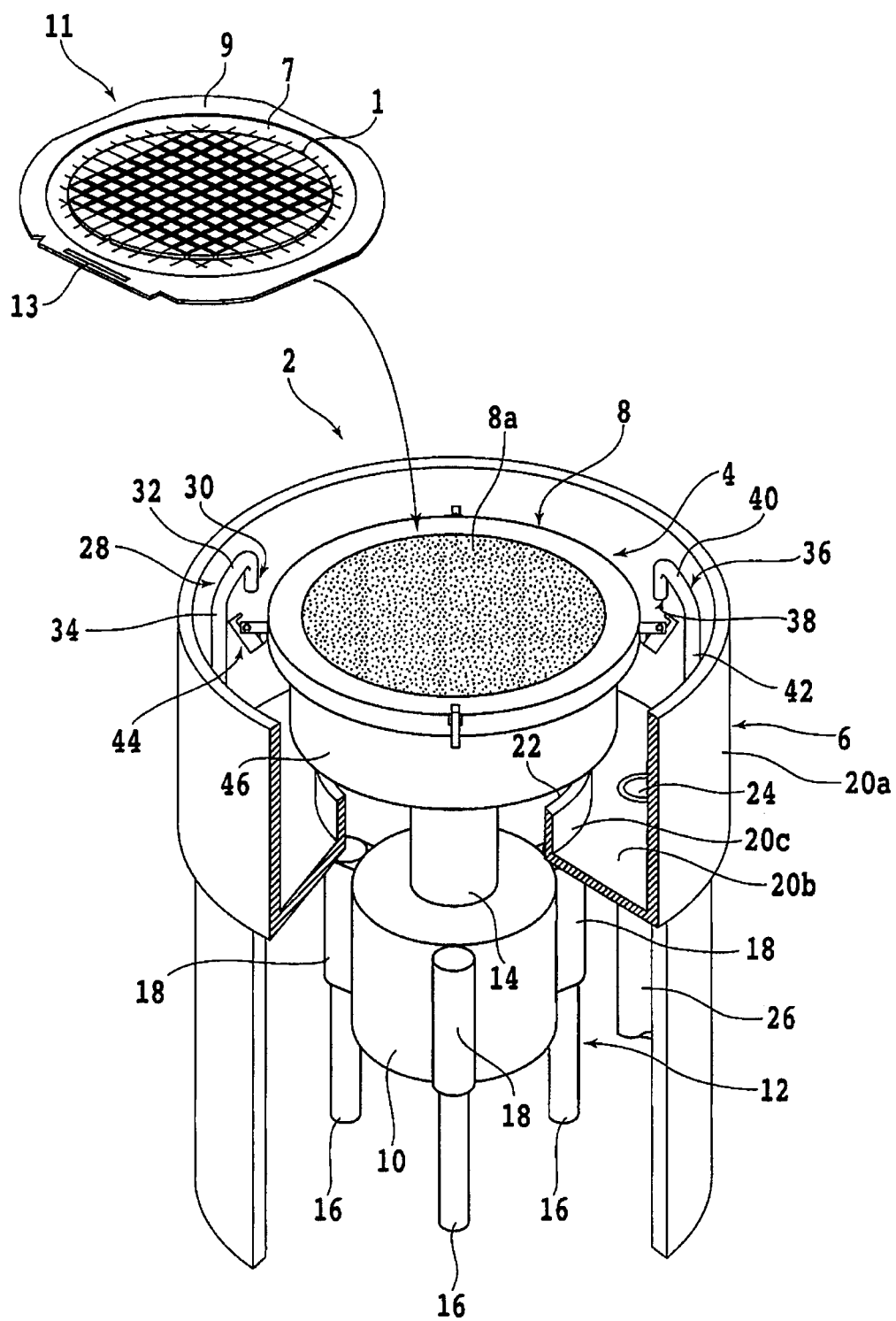
FIG. 2 is a perspective view schematically depicting a cleaning apparatus and the frame unit.

Description will next be of a cleaning apparatus that performs the cleaning method according to the present embodiment. FIG. 2 is a partially broken perspective view schematically depicting a cleaning apparatus 2 and the frame unit 11. The cleaning apparatus 2 includes: a spinner table mechanism 4; a cleaning water receiving mechanism 6 surrounding the periphery of the spinner table mechanism 4; a cleaning mechanism 36 that cleans a to-be-cleaned object; and a drying mechanism 28 that dries the to-be-cleaned object that has been cleaned. The spinner table mechanism 4 includes: a spinner table 8; a motor 10 that rotates the spinner table 8 about an axis that is along a direction perpendicular to the upper surface of the spinner table 8; and a supporting mechanism 12 that vertically movably supports the motor 10. A porous member 8*a* exposed upward is disposed in an upper portion of the spinner table 8. A suction passage (not depicted) having one end connected to a suction source not depicted in the figure and having another end connected to the porous member 8*a* is disposed inside the spinner table 8. When the to-be-cleaned object is placed on the spinner table 8, and the suction source is actuated to make a negative pressure act on the to-be-cleaned object through the suction passage and the porous member 8*a*, the to-be-cleaned object is sucked and held on the spinner table 8. That is, the upper surface of the spinner table 8 is a holding surface.

A lower portion of the spinner table 8 is connected with an upper end of an output shaft 14. A lower end of the output shaft 14 is connected with the motor 10. The output shaft 14 transmits a rotational force generated by the motor 10 to the spinner table 8. The motor 10 is supported by the supporting mechanism 12. The supporting mechanism 12 includes a plurality of air cylinders 18 attached to the motor 10. Supporting legs 16 are connected to lower portions of the respective air cylinders 18. When the air cylinders 18 are actuated simultaneously, the motor 10 and the spinner table 8 can be raised or lowered. At a time of carrying in or out the to-be-cleaned object, the spinner table 8 is raised to a predetermined carrying-in/out position by actuating the supporting mechanism 12. At a time of cleaning the to-be-cleaned object, the spinner table 8 is lowered to a predetermined cleaning position.

The cleaning water receiving mechanism 6 includes: a cylindrical outer circumferential wall 20*a*; an annular bottom wall 20*b* projecting radially inward from a lower portion of the outer circumferential wall 20*a*; and an inner circumferential wall 20*c* erected upward from the inner circumferential side of the bottom wall 20*b*. The inside of the inner circumferential wall 20*c* constitutes a through hole 22. The output shaft 14 is passed through the through hole 22. The periphery of the output shaft 14 is provided with a cover member 46 having such a size as to surround the inner circumferential wall 20*c* from the outer peripheral side of the inner circumferential wall 20*c*. The bottom wall 20*b* is provided with a drainage port 24. A drainage passage 26 is connected to the drainage port 24. When a cleaning liquid drops into the cleaning water receiving mechanism 6, the cleaning liquid is discharged from the drainage port 24 through the drainage passage 26 to the outside. When the spinner table 8 is lowered to the cleaning position, the inner circumferential wall 20*c* is surrounded by the cover member 46, so that the scattering of the cleaning liquid to the motor 10 side through the through hole 22 is suppressed.

A pipe-shaped drying shaft portion 34 of the drying mechanism 28 pierces the bottom wall 20*b*. The drying shaft portion 34 is a pipe-shaped member extending on the outside of the spinner table 8 along a direction perpendicular to the upper surface of the spinner table 8. The drying shaft portion 34 reaches a position higher than the height of the upper surface of the spinner table 8. A drying arm portion 32 is connected to an upper end of the drying shaft portion 34. A motor 34*a* (see FIG. 8 or the like) that rotates the drying shaft portion 34 is connected to the base end side of the drying shaft portion 34. The drying shaft portion 34 is rotated about the perpendicular direction by the motor 34*a*. The drying arm portion 32 is a pipe-shaped member having a length corresponding to a distance from the drying shaft portion 34 to the center of the spinner table 8, and extending in a direction perpendicular to the extending direction of the drying shaft portion 34. A drying nozzle 30 facing downward is disposed at an end of the drying arm portion 32. The drying mechanism 28 includes an air supply source not depicted in the figure. The drying mechanism 28 has a function of removing the cleaning liquid adhering to the to-be-cleaned object by passing air through the drying shaft portion 34 and the drying arm portion 32 and jetting the air from the drying nozzle 30 to the to-be-cleaned object held on the spinner table 8.

Further, a pipe-shaped shaft portion 42 of the cleaning mechanism 36 pierces the bottom wall 20*b*. The shaft portion 42 is a pipe-shaped member extending on the outside of the spinner table 8 along a direction perpendicular to the upper surface of the spinner table 8. The shaft portion 42 reaches a position higher than the height of the upper surface of the spinner table 8. An arm portion 40 is connected to an upper end of the shaft portion 42. A motor 42*a* that rotates the shaft portion 42 (see FIG. 3 and the like) is connected to the base end side of the shaft portion 42. The shaft portion 42 is rotated about the perpendicular direction by the motor 42*a*. The arm portion 40 is a pipe-shaped member having a length corresponding to a distance from the shaft portion 42 to the center of the spinner table 8 and extending in a direction perpendicular to the extending direction of the shaft portion 42. A cleaning nozzle 38 facing downward is disposed at an end of the arm portion 40. The cleaning mechanism 36 includes a cleaning liquid supply source not depicted in the figure. The cleaning mechanism 36 has a function of removing the processing waste or the like adhering to the to-be-cleaned object by passing the cleaning liquid through the shaft portion 42 and the arm portion 40 and jetting the cleaning liquid from the cleaning nozzle 38 to the to-be-cleaned object held on the spinner table 8. The shaft portion 42 and the arm portion 40 function as a supply passage supplying the cleaning liquid.

Clamps 44 that hold the frame 9 of the frame unit 11 are arranged on the outer circumferential side of the upper portion of the spinner table 8. Weight parts of the clamps 44 are moved to the outer circumferential side by a centrifugal force generated by the rotation of the spinner table 8. Upper gripping portions of the clamps 44 thereby automatically fall to the inner circumferential side to grip the frame 9.

Figure 3:
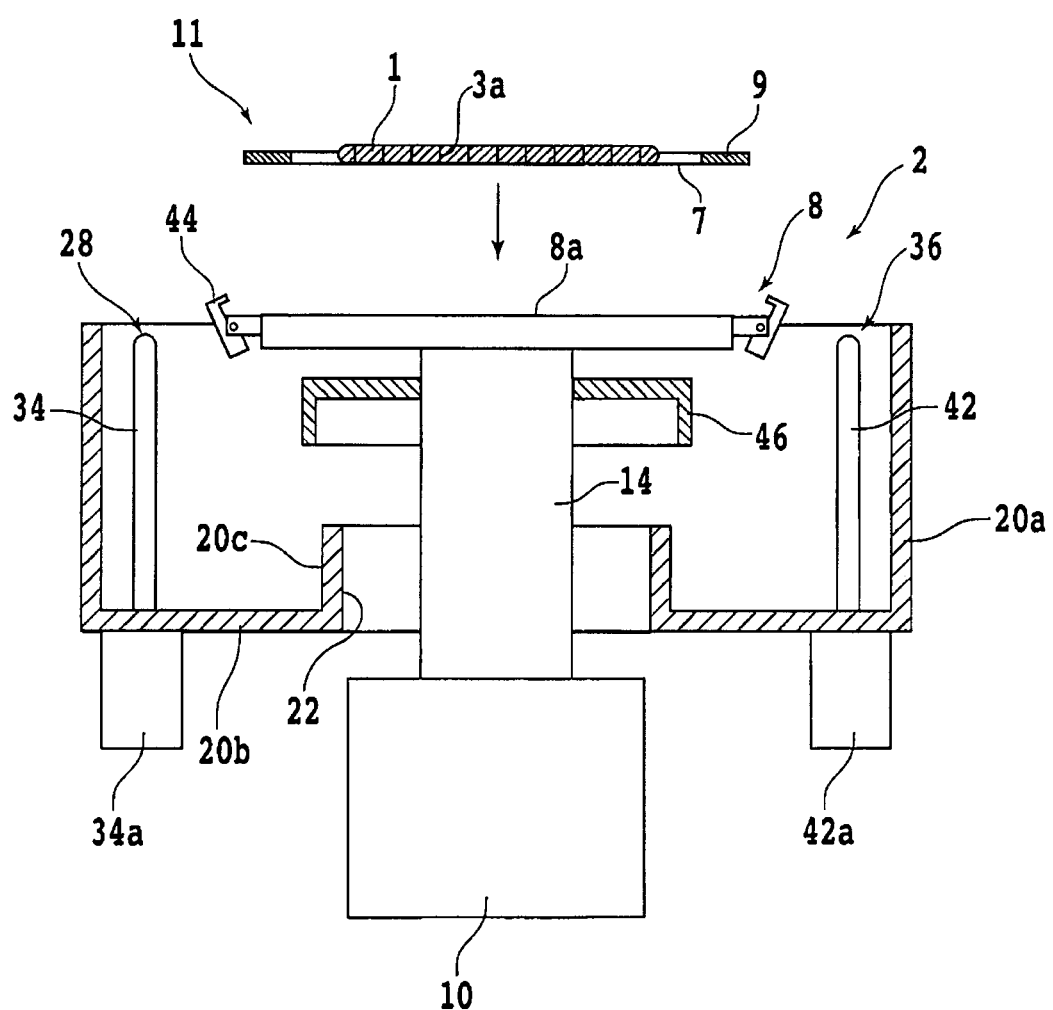
FIG. 3 is a sectional view schematically depicting a holding step.

Each step of the cleaning method according to the present embodiment will next be described in detail. The cleaning method performs a holding step of holding the frame unit 11 on the holding surface of the spinner table 8. FIG. 3 is a sectional view schematically depicting the holding step. When the holding step is to be performed, the spinner table 8 is raised to the predetermined carrying-in/out position in advance by actuating the supporting mechanism 12. Then, the frame unit 11 including the affixed object 1 after processing as the to-be-cleaned object is carried in to the cleaning apparatus 2, and the frame unit 11 is placed on the holding surface of the spinner table 8 via the tape 7. When a negative pressure is thereafter made to act on the frame unit 11 by actuating the suction source (not depicted) of the spinner table mechanism 4, the frame unit 11 is sucked and held on the spinner table 8. Next, the frame unit 11 is lowered to the predetermined cleaning position by actuating the supporting mechanism 12.

Figure 4:
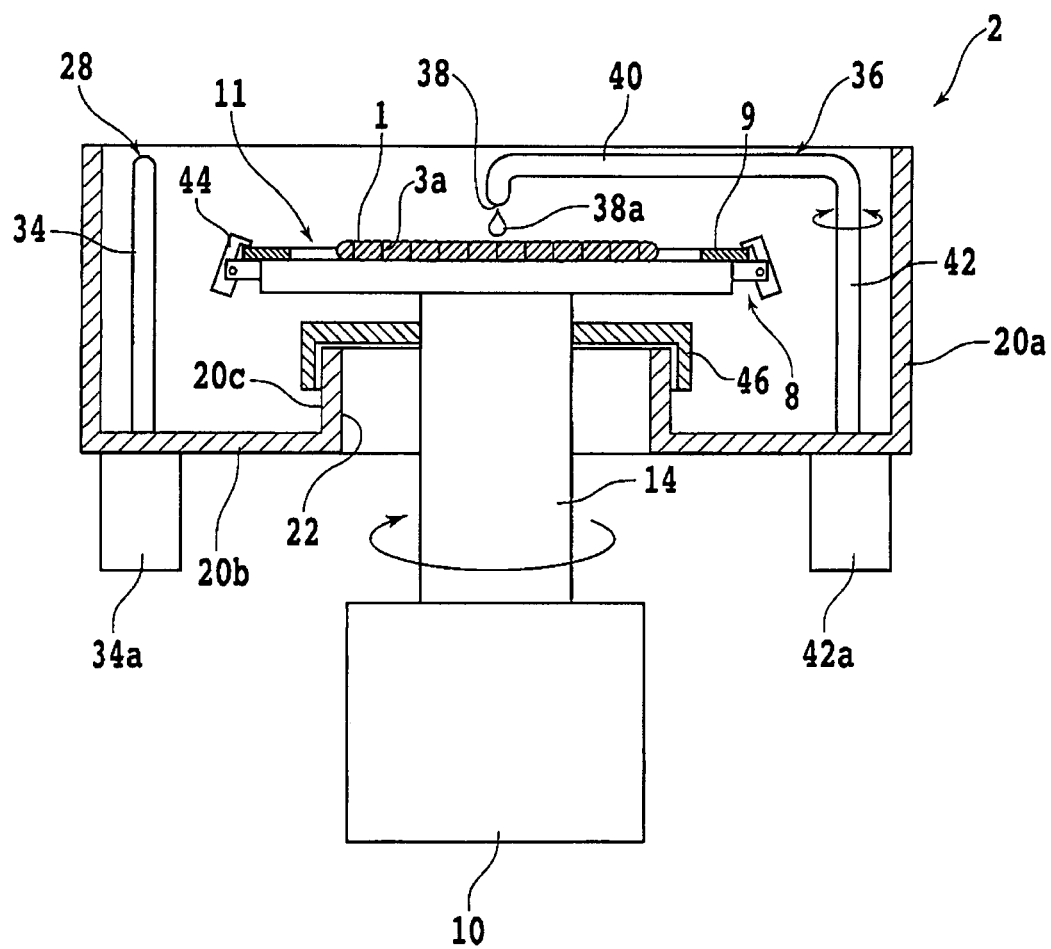
FIG. 4 is a sectional view schematically depicting an affixed object cleaning step.

The cleaning method next performs an affixed object cleaning step of cleaning mainly the affixed object 1 and a frame cleaning step of cleaning mainly the frame 9. The affixed object cleaning step will first be described. FIG. 4 is a sectional view schematically depicting the affixed object cleaning step. As depicted in FIG. 4, the output shaft 14 is rotated by actuating the motor 10, and thereby the spinner table 8 holding the frame unit 11 is rotated. When the spinner table 8 is rotated, the clamps 44 are actuated by the action of a centrifugal force, so that the frame 9 is gripped by the clamps 44. Next, the shaft portion 42 is rotated by actuating the motor 42a while a cleaning liquid 38a is jetted downward from the cleaning nozzle 38. When the shaft portion 42 is rotated, the cleaning nozzle 38 moves along an arcuate path having the arm portion 40 as a radius thereof.

Figure 5:
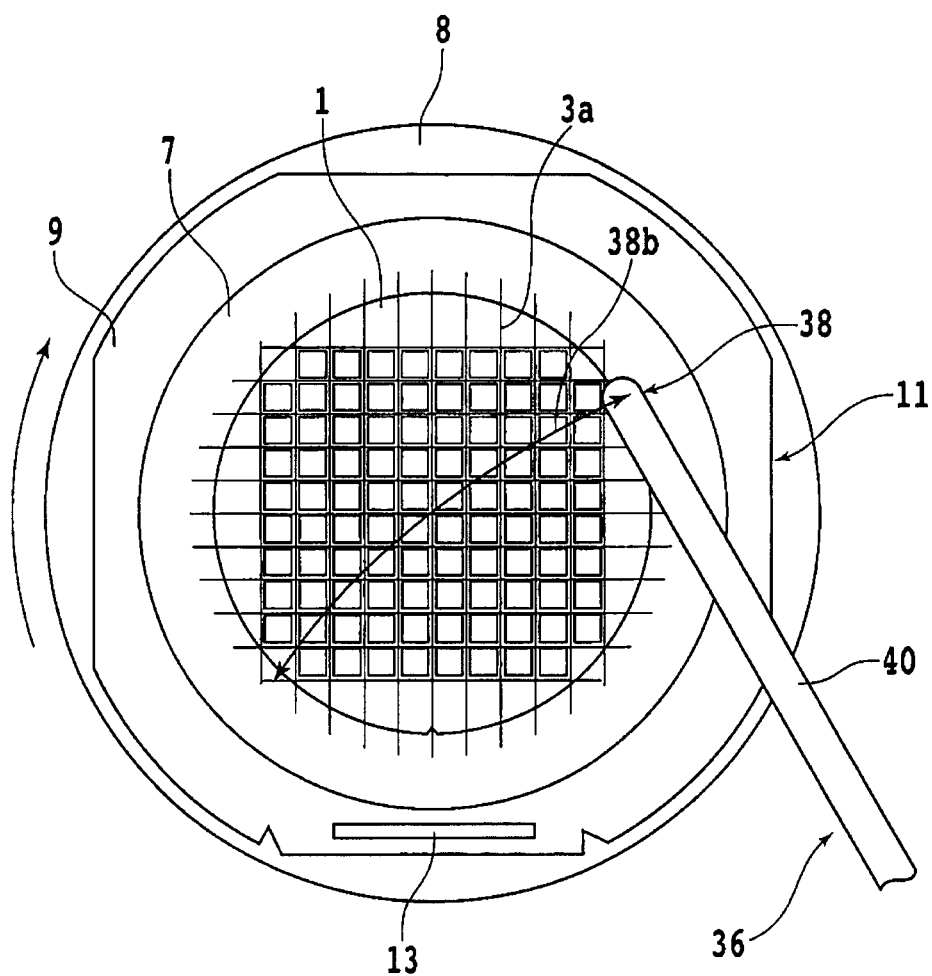
FIG. 5 is a top view schematically depicting the affixed object cleaning step.

The movement of the cleaning nozzle 38 in the affixed object cleaning step will be described with reference to FIG. 5. FIG. 5 is a top view schematically depicting the to-be-cleaned object cleaning step. FIG. 5 depicts a movement path 38b of the cleaning nozzle 38 in the affixed object cleaning step. As depicted in FIG. 5, in the present step, the cleaning nozzle 38 is moved in a reciprocating manner along a path passing above the center of the holding surface of the spinner table 8 and extending from above one end of an outer peripheral edge of the affixed object 1 to above another end of the outer peripheral edge of the affixed object 1. In the affixed object cleaning step, the cleaning nozzle 38 moves in a reciprocating manner above the affixed object 1 while jetting the cleaning liquid 38a. Therefore, mainly the top surface of the affixed object 1 is cleaned to remove, for example, processing waste adhering to the top surface, a water-soluble resin applied to the top surface, or the like.

Figure 6:
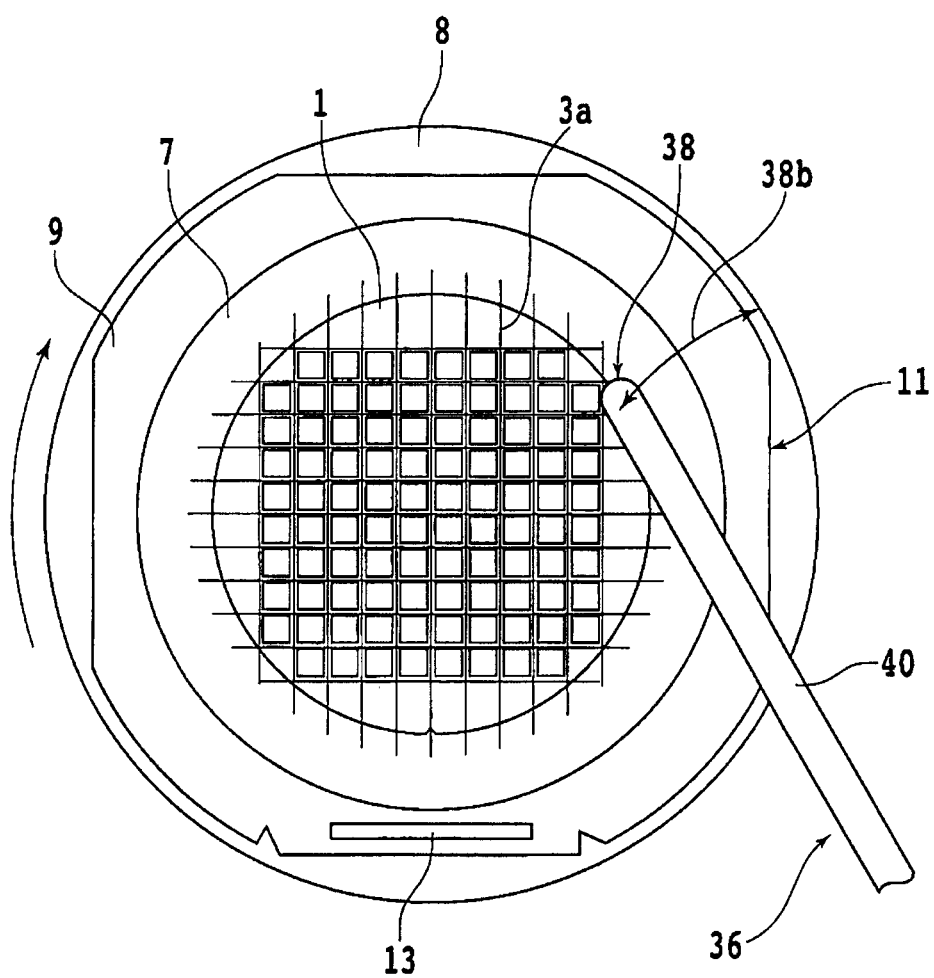
FIG. 6 is a top view schematically depicting an example of a frame cleaning step.

The frame cleaning step will next be described. Also in the frame cleaning step, as in the above-described affixed object cleaning step, the spinner table 8 is rotated, and the shaft portion 42 is rotated by actuating the motor 42a while the cleaning liquid 38a is jetted downward from the cleaning nozzle 38. In the frame cleaning step, the frame is cleaned by jetting the cleaning liquid from the cleaning nozzle to the frame. The movement of the cleaning nozzle 38 in the frame cleaning step will be described with reference to FIG. 6. FIG. 6 is a top view schematically depicting an example of the frame cleaning step. FIG. 6 depicts the movement path 38b of the cleaning nozzle 38 in the frame cleaning step. In the example depicted in FIG. 6, the cleaning nozzle 38 is moved in a reciprocating manner along a path including a region above the frame 9. In the frame cleaning step, the cleaning nozzle 38 moves in a reciprocating manner above the frame 9 while jetting the cleaning liquid 38a. Therefore, mainly the top surface of the frame 9 is cleaned to remove, for example, processing waste adhering to the indication 13 of the identification information of the affixed object 1, the indication 13 being provided on the top surface of the frame 9.

A cleaning strength necessary for the affixed object 1 such as a wafer or the like on which the devices 5 are formed is different from a cleaning strength necessary for the frame 9 on which the indication 13 of the identification information is disposed. Here, a cleaning strength is, for example, the strength of a cleaning action which strength is determined by the length of a time for which cleaning is performed or the like. In a case where the cleaning strengths necessary for the affixed object 1 and the frame 9 are not similar to each other, for example, when the frame unit 11 is cleaned in one cleaning step, the entire top surface of the frame unit 11 is cleaned with the cleaning strength necessary for the to-be-cleaned object that needs a relatively high cleaning strength. In this case, the to-be-cleaned object that needs a relative low cleaning strength is cleaned excessively.

On the other hand, the cleaning method according to the present embodiment can clean the affixed object 1 and the frame 9 with the respective necessary cleaning strengths by performing the cleaning in two divided steps, that is, the affixed object cleaning step and the frame cleaning step. In a case where the cleaning strength necessary for the affixed object 1 is higher than the cleaning strength necessary for the frame 9, for example, the cleaning strength achieved by the affixed object cleaning step is made relatively high by performing the affixed object cleaning step for a longer time than that of the frame cleaning step. In this case, the frame 9 that needs a relative low cleaning strength can be cleaned with the appropriate cleaning strength, and therefore the frame 9 is not cleaned for an excessively long time. A time taken to clean the frame unit 11 can therefore be shortened.

The cleaning method according to the present embodiment may perform the frame cleaning step after performing the affixed object cleaning step. When the top surface 1a of the affixed object 1 is cleaned, the processing waste adhering to the top surface 1a or the like is carried away to the outside by the cleaning liquid. At this time, a part of the processing waste may adhere again to the frame 9 located on the periphery of the affixed object 1. Accordingly, when the frame cleaning step is performed after the affixed object cleaning step is performed, the processing waste adhering again to the frame 9 or the like can be removed by the cleaning liquid 38a. However, the present embodiment is not limited to this.

Figure 7:
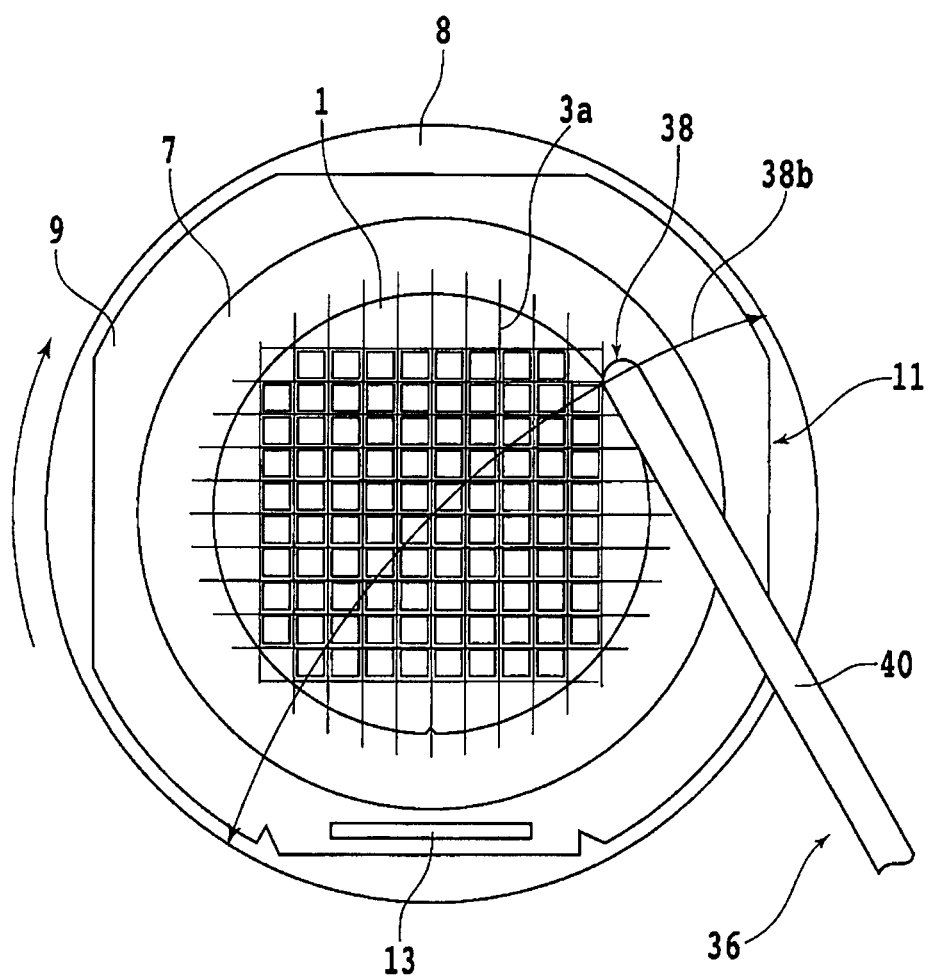
FIG. 7 is a top view schematically depicting another example of the frame cleaning step.

In addition, in the frame cleaning step, the affixed object 1 may be further cleaned together with the frame 9 by moving the cleaning nozzle 38 in a reciprocating manner along the path passing above the center of the holding surface and extending from above one end of an outer peripheral edge of the frame 9 to above another end of the outer peripheral edge of the frame 9. FIG. 7 is a top view schematically depicting another example of the frame cleaning step. FIG. 7 depicts the movement path 38b of the cleaning nozzle 38. In this case, when the processing waste adhering again to the frame 9 or the like is removed, the removed processing waste or the like can be prevented from repeated adhesion to the top surface of the affixed object 1. In addition, in this case, the execution time of the frame cleaning step is determined on the basis of the cleaning strength necessary for the frame 9. Then, the execution time of the affixed object cleaning step is determined on the basis of a cleaning strength obtained by subtracting the cleaning strength of the affixed object 1 cleaned in the frame cleaning step from the cleaning strength necessary for the affixed object 1. For example, suppose that the execution time of the affixed object cleaning step that cleans the affixed object 1 is 150 seconds, and that the execution time of the frame cleaning step that cleans the affixed object 1 and the frame 9 is 30 seconds. In this case, a total time required to clean the frame unit 11 is 180 seconds. When the frame unit 11 that can be thus cleaned was actually cleaned in one cleaning step without the use of the present embodiment, it took 311 seconds to clean the whole of the frame unit 11.

The cleaning method according to the present embodiment can clean the affixed object 1 and the frame 9 with the cleaning strengths necessary for the affixed object 1 and the frame 9, respectively, and therefore does not perform excessive cleaning. In a case where the cleaning strengths are adjusted by a cleaning time, for example, a time needed for the conventional excessive cleaning can be omitted by the cleaning method, and therefore a time required to clean the frame unit 11 can be shortened. Further, in the frame cleaning step, the cleaning nozzle 38 may be moved in a reciprocating manner along a path including only the region above the frame 9. In this case, the respective cleaning steps for the affixed object 1 and the frame 9 can be performed according to the cleaning strengths necessary for the affixed object 1 and the frame 9, respectively. That is, the cleaning strength of each cleaning step can be determined without consideration of the cleaning strength of the other cleaning step, and therefore the execution time of each step or the like can be determined easily.

Figure 8:
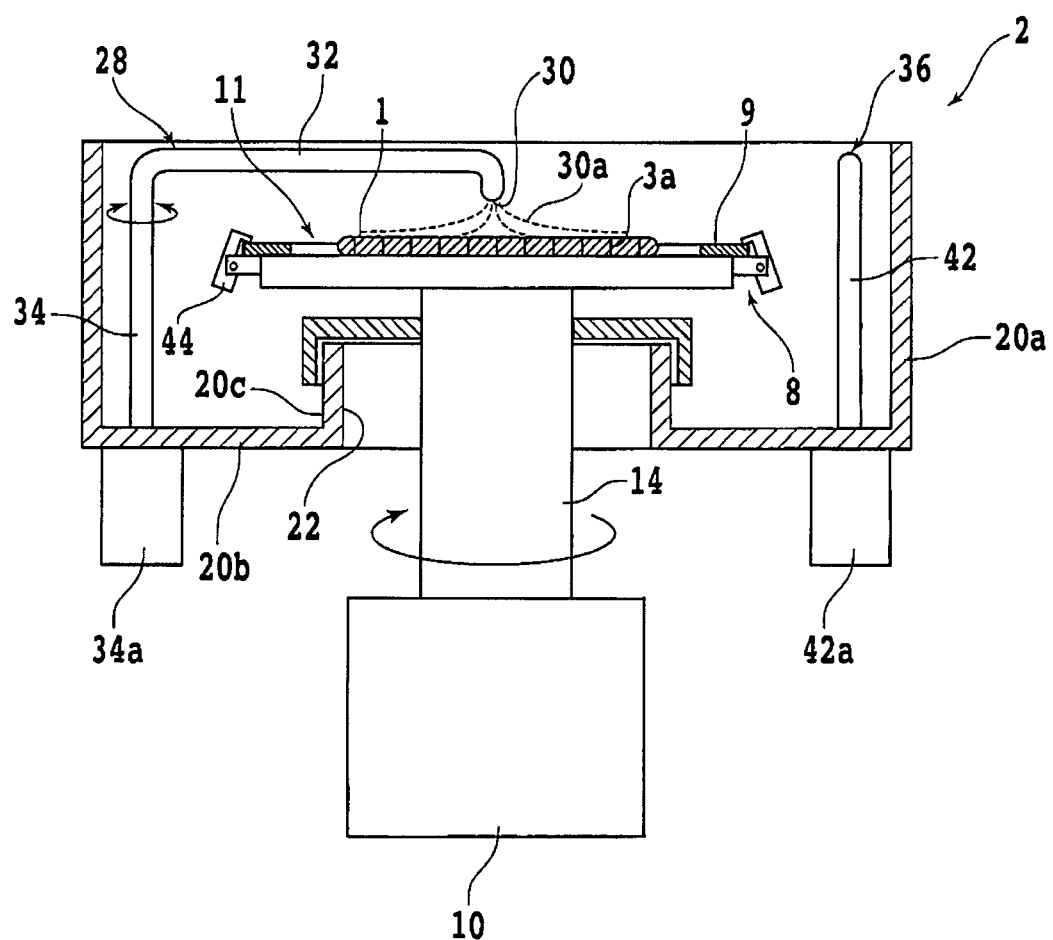
FIG. 8 is a sectional view schematically depicting a drying step.

After the affixed object cleaning step and the frame cleaning step are performed, a drying step is performed. The drying step will be described with reference to FIG. 8. FIG. 8 is a sectional view schematically depicting the drying step. In the drying step, the spinner table 8 is rotated, and the drying shaft portion 34 is rotated by actuating the motor 34a while air 30a is jetted downward from the drying nozzle 30. As in the affixed object cleaning step and the frame cleaning step, the drying nozzle 30 jetting the air 30a is moved in a reciprocating manner to remove the cleaning liquid adhering to the top surface of the frame unit 11 and dry the frame unit 11. After the frame unit 11 dried, the spinner table 8 is raised to the predetermined carrying-in/out position of the spinner table 8 by actuating the supporting mechanism 12, and the frame unit 11 is carried out from the spinner table 8.

It is to be noted that the present invention is not limited to the description of the foregoing embodiment, but can be modified and carried out in various manners. For example, in the foregoing embodiment, description has been made of a case where the frame cleaning step is carried out after the affixed object cleaning step. However, one mode of the present invention is not limited to this. For example, in the case where the cleaning strength necessary for the affixed object 1 is higher than the cleaning strength necessary for the frame 9, the affixed object cleaning step may be carried out after the frame cleaning step is carried out. When the frame cleaning step is carried out after the affixed object cleaning step is carried out, the processing waste adhering again to the frame 9 as a result of the affixed object cleaning step is captured by the cleaning liquid jetted to the edge of the frame 9 and the like in the frame cleaning step. Then, the cleaning liquid including the processing waste and the like may scatter also onto the top surface of the affixed object 1.

The order of the affixed object cleaning step and the frame cleaning step is selected as appropriate according to the cleaning strengths necessary for the affixed object 1 and the frame 9 or the like, respectively, the description of processing performed on the affixed object 1, the size of the affixed object 1 and the frame 9, and the like. Further, in order to remove the processing waste or the like from the frame unit 11 more surely, the two steps may be alternately performed a plurality of times by, for example, performing the frame cleaning step after performing the affixed object cleaning step, and thereafter further performing the affixed object cleaning step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cleaning method for cleaning a frame unit including an affixed object, a tape affixed to an undersurface of the affixed object, and an annular frame to which an outer peripheral portion of the tape is affixed, wherein an indication of identification information of the affixed object is formed on a surface of the annular frame, the cleaning method comprising:
  a processing step of processing the affixed object along a plurality of planned processing lines and dividing the affixed object along the planned processing lines;
  a holding step of holding the frame unit on a holding surface of a spinner table;
  an affixed object cleaning step of cleaning the affixed object by jetting a cleaning liquid from a cleaning nozzle while rotating the spinner table holding the frame unit and moving the cleaning nozzle in a reciprocating manner along a first path passing above a center of the holding surface and extending from above one end of an outer peripheral edge of the affixed object to above another end of the outer peripheral edge of the affixed object; and
  a frame cleaning step of cleaning the annular frame, including cleaning the indication, conducted after the affixed object cleaning step, comprising jetting the cleaning liquid from the cleaning nozzle to the frame while rotating the spinner table, and wherein the cleaning nozzle is moved in a reciprocating manner along a second path;
  wherein the affixed object cleaning step is performed for a first period of time and the frame cleaning step is performed for a second period of time, and wherein the first period of time is greater than the second period of time, and
  wherein the frame cleaning step and the affixed object cleaning step are both performed after the processing step.

2. The cleaning method according to claim 1, wherein:
  in the frame cleaning step, the affixed object is cleaned together with the annular frame by moving the cleaning nozzle in a reciprocating manner along the second path passing above the center of the holding surface and extending from above one end of an outer peripheral edge of the frame to above another end of the outer peripheral edge of the frame, and wherein an upper surface of the frame comprises the indication of identification information.

3. The cleaning method according to claim 1, wherein:
  in the frame cleaning step, the second path including only a region above an upper surface of the annular frame.

4. The cleaning method according to claim 1, wherein:
  the affixed object cleaning step comprises a change in direction of moving the cleaning nozzle in the reciprocating manner occurs prior to a point where the cleaning nozzle reaches the annular frame.

5. A cleaning method for cleaning a frame unit including an affixed object, a tape affixed to an undersurface of the affixed object, and an annular frame to which an outer peripheral portion of the tape is affixed, wherein an indication of identification information of the affixed object is formed on a surface of the annular frame, the cleaning method comprising:
- a processing step of processing the affixed object along a plurality of planned processing lines and dividing the affixed object along the planned processing lines;
- a holding step of holding the frame unit on a holding surface of a spinner table;
- an affixed object cleaning step of cleaning the affixed object by jetting a cleaning liquid from a cleaning nozzle while rotating the spinner table holding the frame unit and moving the cleaning nozzle in a reciprocating manner along a first path passing above a center of the holding surface and extending from above one end of an outer peripheral edge of the affixed object to above another end of the outer peripheral edge of the affixed object, wherein a change in direction of moving the cleaning nozzle in the reciprocating manner occurs prior to a point where the cleaning nozzle reaches the annular frame; and
- a frame cleaning step of cleaning the frame, including cleaning the indication, by jetting the cleaning liquid from the cleaning nozzle to the annular frame while rotating the spinner table, wherein the cleaning nozzle is moved in a reciprocating manner along a second path, and wherein the frame cleaning step and the affixed object cleaning step are both performed after the processing step.

6. The cleaning method according to claim 5, wherein:
in the frame cleaning step, the affixed object is cleaned together with the annular frame by moving the cleaning nozzle in a reciprocating manner along the second path passing above the center of the holding surface and extending from above one end of an outer peripheral edge of the frame to above another end of the outer peripheral edge of the frame, wherein an upper surface of the frame comprises the indication of identification information.

7. The cleaning method according to claim 5, wherein:
in the frame cleaning step, the second path including only a region above an upper surface of the annular frame.

8. The cleaning method according to claim 5, wherein:
the affixed object cleaning step is performed for a first period of time and the frame cleaning step is performed for a second period of time, and wherein the first period of time is greater than the second period of time.

* * * * *